United States Patent
Munoz et al.

(10) Patent No.: US 6,396,127 B1
(45) Date of Patent: *May 28, 2002

(54) SEMICONDUCTOR PACKAGE

(75) Inventors: Jorge Munoz, Cypress; Rod DeLeon, Palmdale, both of CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/476,825

(22) Filed: Jan. 3, 2000

Related U.S. Application Data

(60) Provisional application No. 60/101,810, filed on Sep. 25, 1998.

(51) Int. Cl.[7] .................... H01L 23/50; H01L 23/495; H01L 23/34; H01L 23/48
(52) U.S. Cl. .................... 257/666; 257/696; 257/698; 257/735; 257/7.2; 257/724; 257/728; 257/401; 257/139; 257/329; 257/334; 257/341; 257/691; 257/675; 257/796
(58) Field of Search .................... 257/666, 696, 257/698, 693, 692, 690, 691, 735, 341, 736, 728, 724, 712, 676, 678, 675, 796, 401, 329–335, 139

(56) References Cited

U.S. PATENT DOCUMENTS

| | | | | |
|---|---|---|---|---|
| 4,189,342 A | * | 2/1980 | Kock ........................ 29/578 |
| 4,935,803 A | * | 6/1990 | Kalfus et al. | |
| 5,218,231 A | * | 6/1993 | Kudo ........................ 257/735 |
| 5,266,834 A | * | 11/1993 | Nishi et al. ................ 257/724 |
| 5,625,226 A | * | 4/1997 | Kinzer ....................... 257/675 |
| 5,637,922 A | * | 6/1997 | Fillion et al. ............... 257/728 |
| 5,647,034 A | * | 7/1997 | Matsuda et al. ............ 257/82 |
| 5,665,996 A | * | 9/1997 | Williams et al. ........... 257/401 |
| 5,814,884 A | | 9/1998 | Davis et al. ............... 257/723 |
| 5,977,630 A | * | 11/1999 | Woodworth et al. ....... 257/712 |
| 6,020,636 A | * | 2/2000 | Adishian ................... 257/728 |
| 6,040,626 A | * | 3/2000 | Cheah et al. .............. 257/735 |
| 6,054,716 A | * | 4/2000 | Sonobe et al. ............. 257/84 |
| 6,144,093 A | * | 11/2000 | Davis et al. ............... 257/724 |
| 6,123,265 A1 | * | 5/2001 | Nagase ...................... 257/678 |
| 6,255,722 B1 | * | 7/2001 | Ewer et al. ................ 257/676 |

FOREIGN PATENT DOCUMENTS

| | | |
|---|---|---|
| EP | 0929107 | 7/1999 |
| JP | 62114260 | 5/1987 |
| JP | 4350365 | 12/1992 |
| JP | 6132468 | 5/1994 |
| JP | 10150140 | 6/1998 |
| JP | 10261756 | 9/1998 |
| JP | 11195973 | 7/1999 |
| JP | 11330353 | 11/1999 |

* cited by examiner

Primary Examiner—Alexander O. Williams
(74) Attorney, Agent, or Firm—Ostrolenk, Faber, Gerb & Soffen, LLP

(57) ABSTRACT

A semiconductor package includes a bottom leadframe having a bottom plate portion and at least one first terminal extending from the bottom plate portion; at least one second terminal being co-planar with the first terminal; a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a copper plate coupled to and spanning a substantial part of the first metalized region defining the source connection, the copper plate including at least one chamfered edge extending upward and away from the first metalized region; and at least one beam portion being sized and shaped to couple the copper plate portion to the at least one second terminal such that it is electrically coupled to the source.

27 Claims, 9 Drawing Sheets

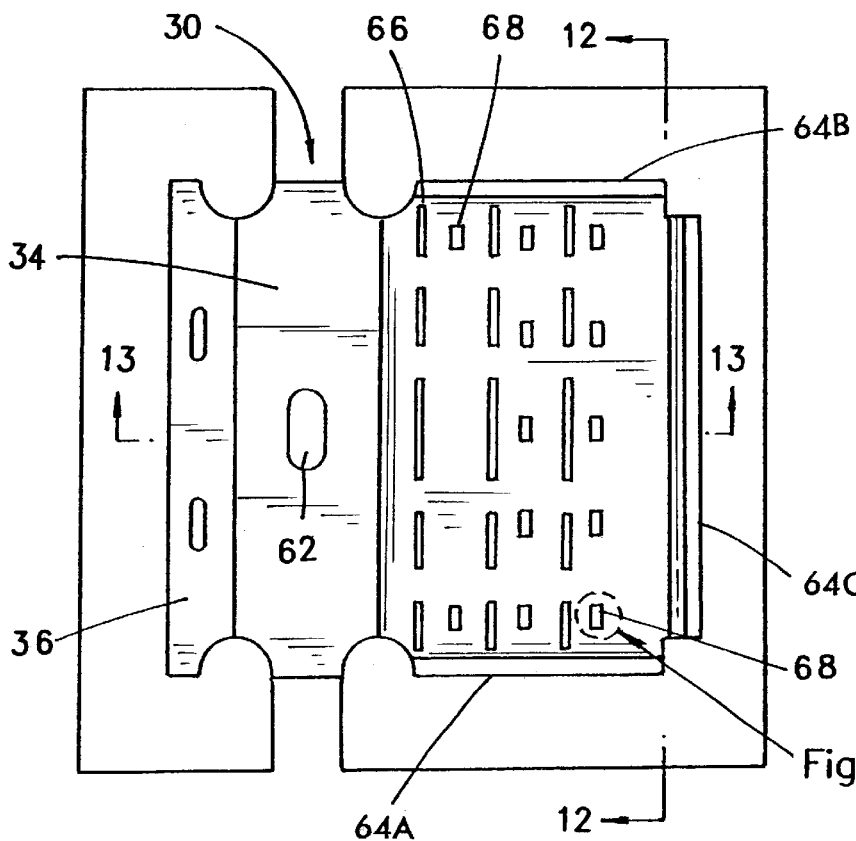
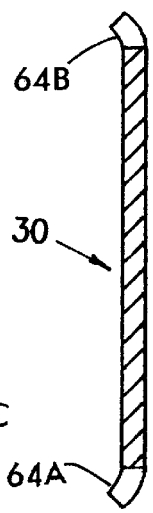
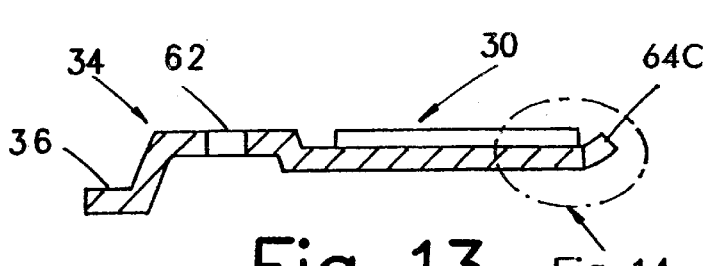
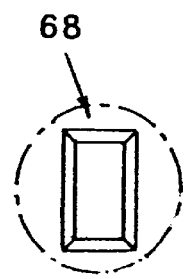
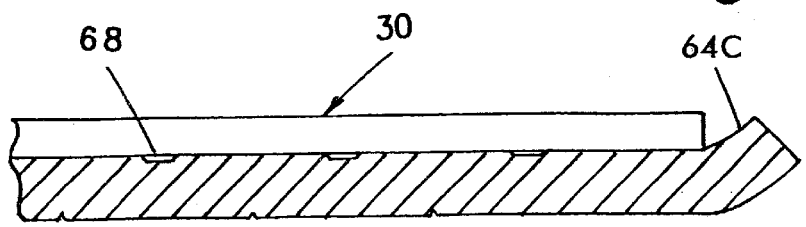

SEMICONDUCTOR PACKAGE

CROSS REFERENCE TO RELATED APPLICATION

This application is based on and claims priority to U.S. Provisional Patent Application No. 60/101,810, filed Sep. 25, 1998, entitled SEMICONDUCTOR PACKAGE, the entire disclosure of which is incorporated herein by reference. This application is related to U.S. patent application Ser. No. 09/225,153.

BACKGROUND OF THE INVENTION

1. Field of the Invention

The present invention is related to a semiconductor package in which a semiconductor die is disposed between upper and lower plate members and, more particularly, to an SO8 semiconductor package in which a source of a MOSFET semiconductor die is electrically coupled to a leadframe via an upper plate member while the MOSFET gate is electrically coupled to the leadframe via a wire bond.

2. Related Art

With reference to FIG. 1, a semiconductor package 10 according to the prior art is shown. The semiconductor package 10 includes a bottom plate portion 13 and terminals 12a, 12b. A semiconductor die 16 is disposed on top of the bottom plate portion 13 and fastened thereto, typically using an epoxy material. The semiconductor die 16 includes a metalized region 18 (typically aluminum) defining a connection area for a top surface of the semiconductor die 16. Portions of the terminals 12a, 12b, bottom plate portion 13, and semiconductor die 16 are encapsulated in a housing 22, typically formed from a moldable material. In order to obtain an electrical connection between the metalized region 18 and the terminal(s) 12b, one or more wires 20 are ultrasonically bonded at one end 21a to the metalized region 18 and at a distal end 21b to the terminal 12b.

FIG. 2 shows another semiconductor package 100 of the prior art. In order to electrically connect the metalized region 18 with the terminal 12b, one or more wires 24 are stitch bonded at locations 23, thereby providing additional paths for current to flow from the semiconductor die 16 to the terminal 12b. This marginally reduces the resistance of the current path from the semiconductor die 16 to the terminal 12b.

It is desirable to significantly reduce the resistance and inductance of current paths through a power semiconductor package in order to ensure optimum performance of the semiconductor device. Unfortunately, the semiconductor packages of the prior art do not fully achieve this objective because, among other things, the distance D between one area of the metalized region 18 and the end 21a of the wires 20 increases the resistance of the current path from the metalized region 18 to the terminal 12b. This problem is exacerbated when the thickness of the metalized region 18 is relatively small (typically, the thickness is approximately 4 to 8 microns). The relatively thin metalized region 18 in combination with the distance D and the cross sectional profile of the wire bond 20 results in a relatively high resistance and inductance for the current path therethrough.

In some packages (for example SO8 packages) the distance D is approximately 80 to 100 mils resulting in a resistance of between about 0.79 and 1.58 mohms for the metalized region 18. The diameters of the wires 20, 24 are approximately 2 mils yielding resistances of about 1.05 mohms (when 14 wires are used). With terminal and epoxy resistances aggregating to about 0.307 mohms, such packages exhibit total resistances of between about 2.14 to 2.93 mohms. The resulting package thermal resistance, RJA, can reach 62.5° C./W.

When the semiconductor package 10 includes, for example, a MOSFET semiconductor die 16, the resistance caused by the distance D and the relatively small diameter of the wires 20, 24 adds to the overall resistance of the MOSFET. Indeed, when die 16 is a MOSFET die, the terminals 12a are typically coupled to the drain of the MOSFET while the terminals 12b are coupled to the source of the MOSFET via one or more wire bonds 20. As ON resistances of MOSFET dies become smaller and smaller, the resistance caused by the distance D and the wire bonds 20, 24 become a larger and larger portion of the overall resistance from one terminal 12a to another terminal 12b. Of course, the high frequency performance of a semiconductor device, like a MOSFET, is significantly effected by the resistance and inductance from terminal to terminal through the device.

Some prior art packages have incorporated a large metal strap to obtain an electrical connection between the metalized region 18 and terminal 12b. Unfortunately, this technique has only been possible in large semiconductor packages having relatively simple surface structures, such as bipolar junction transistors, diodes, and thyristors. Further, the metal straps were not practical in small outline packages (such as SO8, surface mount dual in line packages).

The use of a large metal strap in a MOS-gated device, such as a MOSFET, has not heretofore been achieved because such devices have relatively complex surface structures. In particular, MOS-gated devices typically include a gate runner (or bus), disposed on the surface of the semiconductor die, which traverses the surface such that gate potential is distributed over the surface of the die. Consequently, disposing a large metal strap over the surface of the die has been problematic because the gate runner restricts access to the die surface and could be shorted to the metal strap. Thus, the use of metal straps in MOS-gated semiconductor devices has been prohibitive.

Accordingly, there is a need in the art for a new semiconductor package which overcomes the deficiencies in the prior art semiconductor packages by, among other things, reducing the resistances of the current paths through MOS-gated devices and reducing the inductances of such current paths.

SUMMARY OF THE INVENTION

In order to overcome the deficiencies of the prior art, a semiconductor package according to one aspect of the instant invention includes a power semiconductor package, comprising: a bottom leadframe having a bottom plate portion and at least one first terminal extending from the bottom plate portion;

at least one second terminal being co-planar with the first terminal; a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a conductive plate coupled to and spanning a substantial part of the first metalized region defining the source connection, the conductive plate including a periphery and at least one chamfered edge at the periphery extending upward and away from the first metalized region; and at least one beam portion being sized and shaped to couple the conductive plate portion to the at least one second terminal such that it is electrically coupled to the source.

According to another aspect of the invention, the package includes: a bottom leadframe having a bottom plate portion and at least one first terminal extending from the bottom plate portion; at least one second terminal being co-planar with the first terminal;

a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a conductive plate coupled to and spanning a substantial part of the first metalized region defining the source connection, a periphery of the conductive plate being defined by a plurality of peripheral edges which circumscribe top and bottom surfaces of the conductive plate; at least one of a plurality of depressions and elongate slots disposed in at least one of the top and bottom surfaces of the conductive plate; at least one beam portion being sized and shaped to couple the conductive plate portion to the at least one second terminal such that it is electrically coupled to the source; and a molded housing which substantially encapsulates the bottom leadframe, semiconductor die and conductive plate.

BRIEF DESCRIPTION OF THE DRAWINGS

For the purpose of illustrating the invention, there are shown in the drawing forms which are presently preferred, it being understood, however, that the invention is not limited to the precise arrangements and instrumentalities shown.

FIG. 11 is a top plan view of the plate portion of the semiconductor package of FIG. 10;

FIG. 12 is a sectional view of the plate portion of FIG. 11 taken through lines 12—12;

FIG. 13 is a sectional view of the plate portion of FIG. 11 taken through lines 13—13;

FIG. 14 is an enlarged view of a section of the plate portion of FIG. 13, labeled FIG. 14; and FIG. 15 is an enlarged view of a part of the plate portion of FIG. 11, labeled FIG. 15 (14 places).

DETAILED DESCRIPTION OF THE PREFERRED EMBODIMENTS

Figure 1:
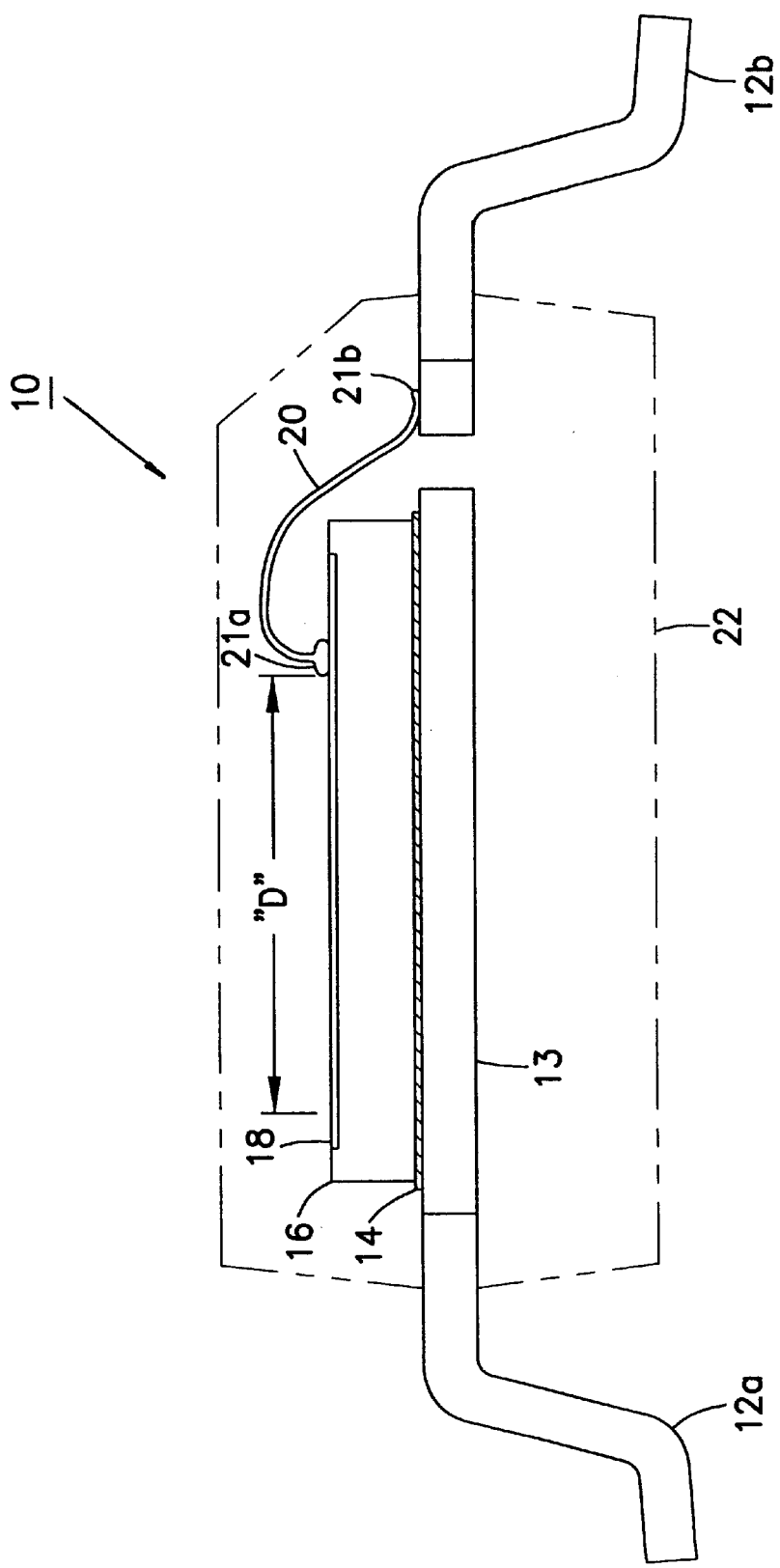
FIG. 1 is a side view of a semiconductor package according to the prior art.
Figure 2:
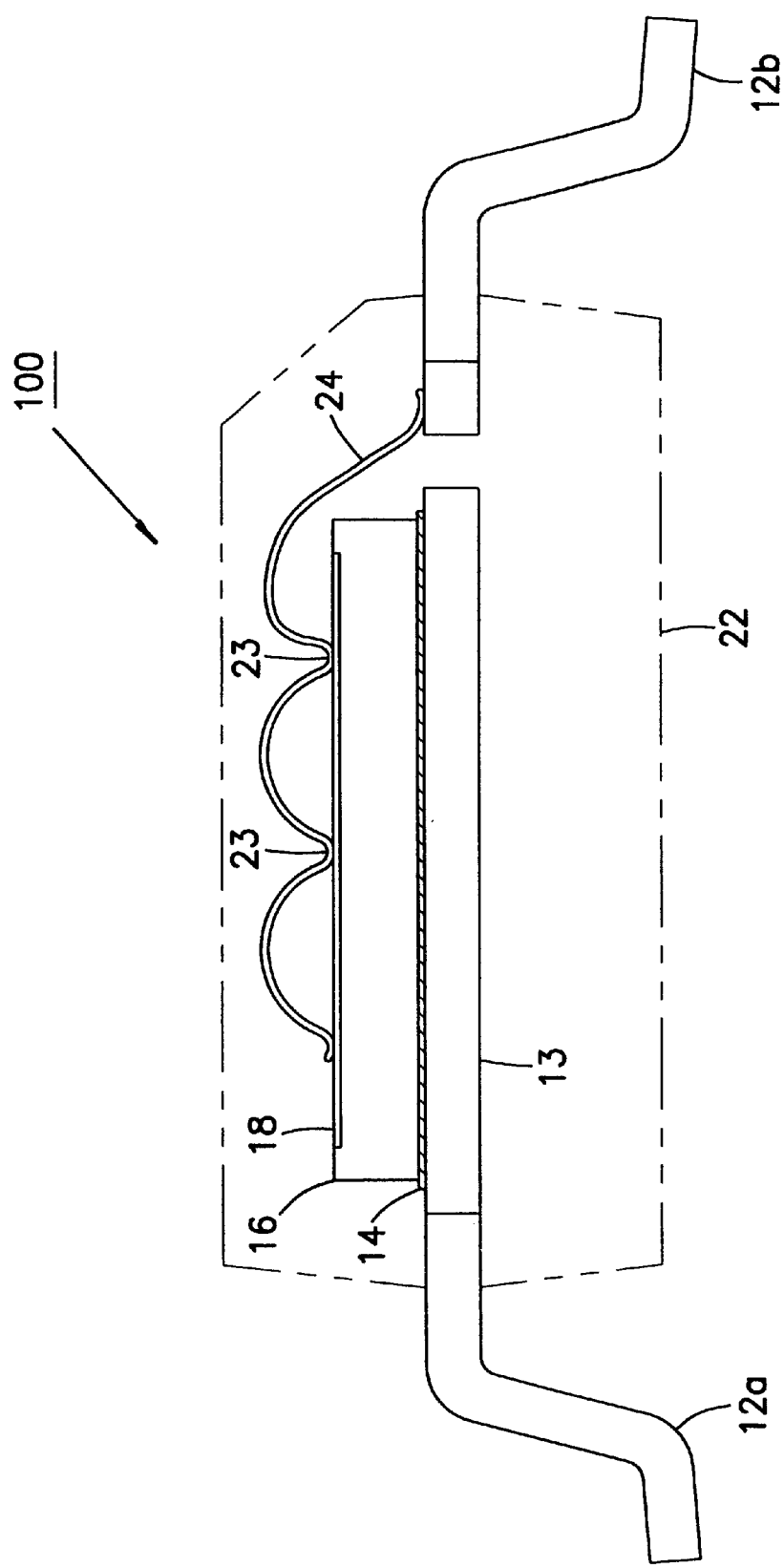
FIG. 2 is a side view of a semiconductor package according to the prior art.
Figure 3:
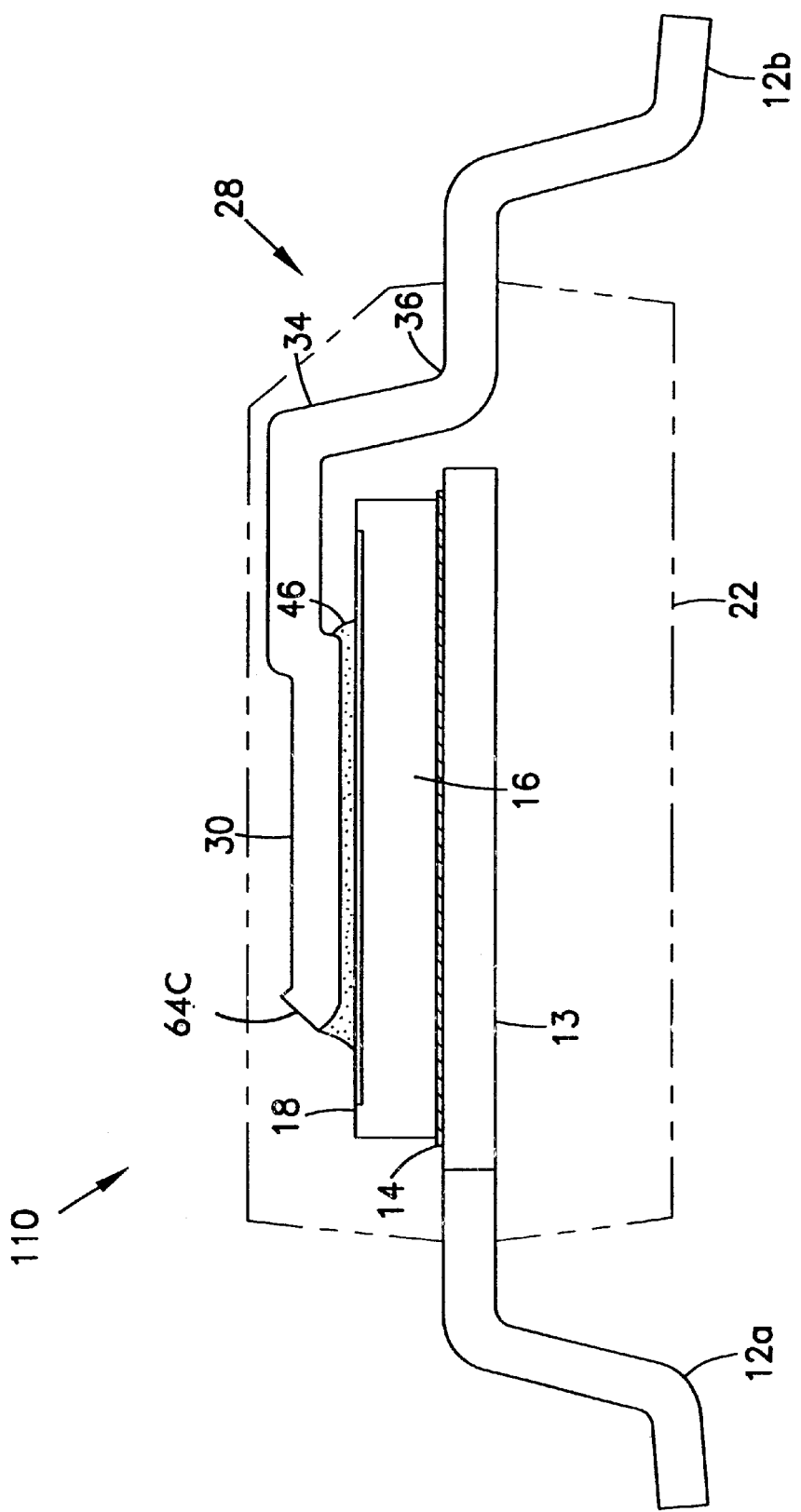
FIG. 3 is a side view of a semiconductor package according to the present invention.
Figure 4:
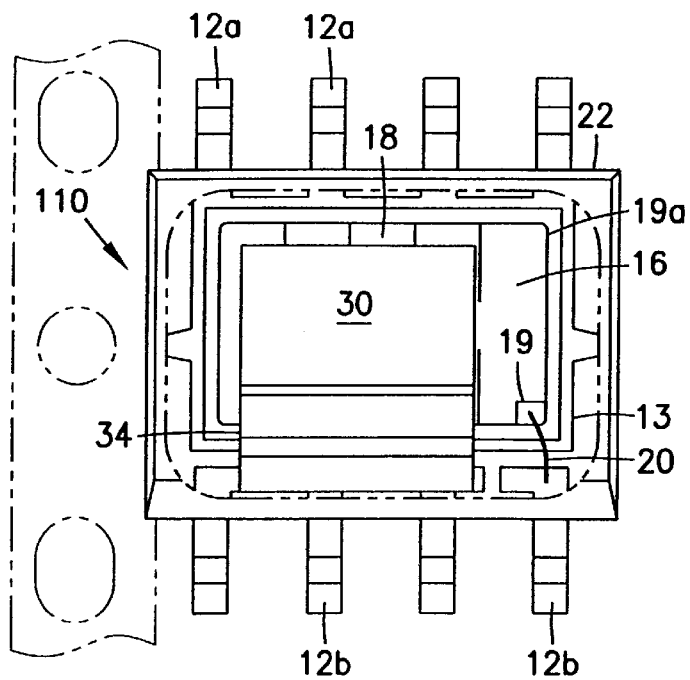
FIG. 4 is a top plan view of an alternative embodiment of the semiconductor package shown in FIG. 3.

Referring now to the drawing wherein like numerals indicate like elements, there is shown in FIG. 3 a perspective view of a semiconductor package 110 in accordance with the present invention. The semiconductor package 110 includes a semiconductor die 16 having a bottom surface coupled to a bottom plate 13. Preferably, the semiconductor die 16 is a MOSFET die and terminals 12a are electrically coupled to the drain of the MOSFET die 16. Of course, the semiconductor die 16 may take on other forms, such as diodes, insulated gate bipolar transistors, or the like.

The semiconductor die 16 includes a top surface having a metalized region 18 which defines a connection to the semiconductor die 16. For example, when the semiconductor die 16 is a MOSFET, metalized region 18 may define a source connection.

The semiconductor package 110 also includes a strap member 28 which is employed to electrically couple the metalized region 18 to one or more of the terminals 12b. Each strap member 28 preferably includes a substantially thick plate portion 30 and a shaped beam portion 34. The plate portion 30 is preferably formed of copper and spans a substantial portion of the metalized region 18. The beam portion 34 is shaped and sized to couple the plate portion 30 to the terminals 12b.

Preferably, the beam portion 34 is coupled, at one end, to a lateral edge of the plate portion 30 and includes a distal end 36 which is coupled to one or more respective terminals 12b.

A curable conductive material 46 (such as silver filled conductive epoxy) is preferably disposed between the lower surface of the plate portion 30 and the metalized region 18 such that the plate 30 is firmly coupled to the metalized region 18.

It is preferred that the semiconductor package 110 include a housing 22 formed from a moldable material (such as plastic) and that the package configuration conforms to the SO8 standard. It is preferred that the molable housing be formed from a low stress mold compound such as EME-6600H or EME-6730B made by Sumitomo as these compounds provide critical advantages in terms of moisture resistance and low induced stress on the die 16 during high temperature reflow.

Advantageously, the strap member 28 provides a relatively large contact area for coupling the terminal 12b to the metalized region 18, thereby reducing resistance to current flow and reducing inductance. This provides for improved performance at high frequencies. Further, this structure also enjoys the advantage of providing a thermal path for heat to escape the semiconductor die 16 through the strap member 28.

As best seen in FIGS. 4 and 6 through 8, which show top views of the semiconductor package 110, the beam portion 34 is preferably integrally formed into one flowing member which extends from one lateral edge of the plate portion 30 and terminates at the terminals 12b.

A metalized region 19 defines a gate of the MOSFET die 16. The metalized region 19 is electrically coupled to one terminal 12b via wire bond 20. Thus, the present invention employs a mixed connection to the MOSFET die 16 top surface, namely, a low resistance plate portion 30 for connecting to the source and a wire bond 20 for connecting to the gate 19.

Figure 8:
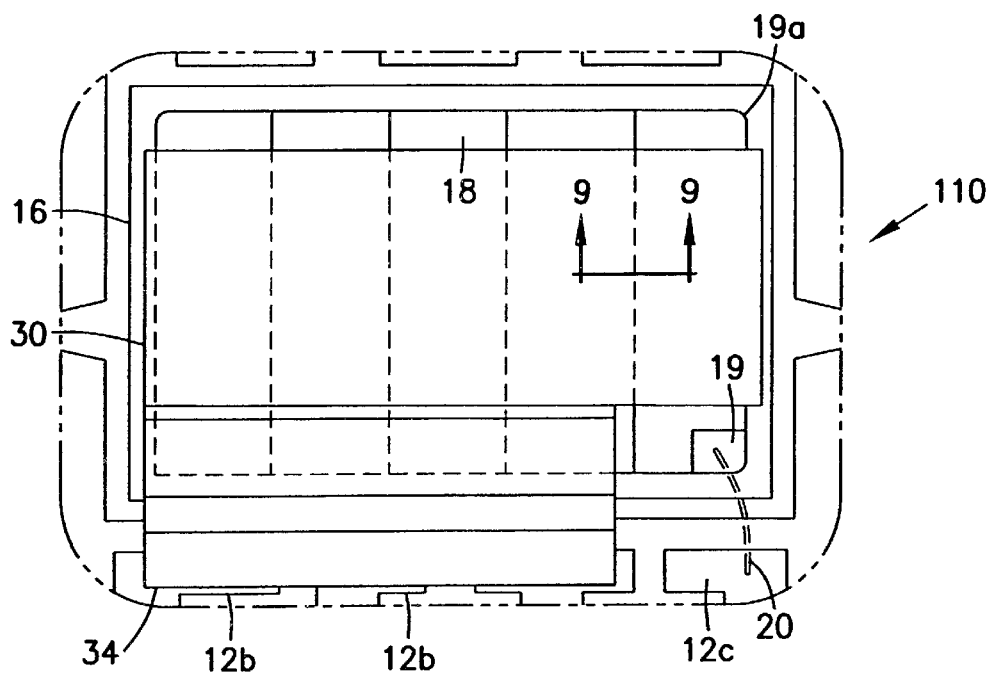
FIG. 8 is a top plan view of an alternative embodiment of the semiconductor package of FIG. 4.
Figure 5:
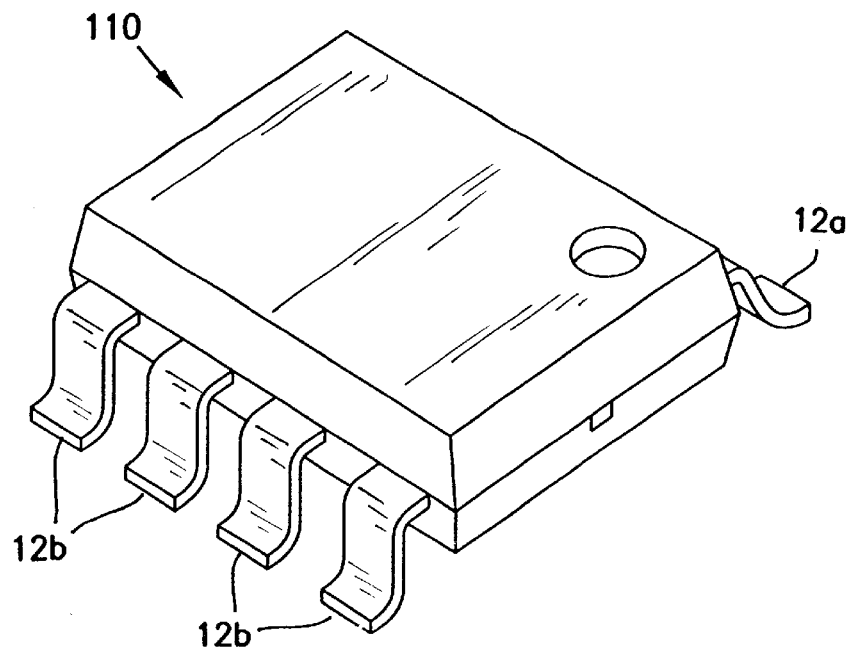
FIGS. 5, 6, and 7 are internal and/or external perspective views of the semiconductor package of FIG. 4.
Figure 6:
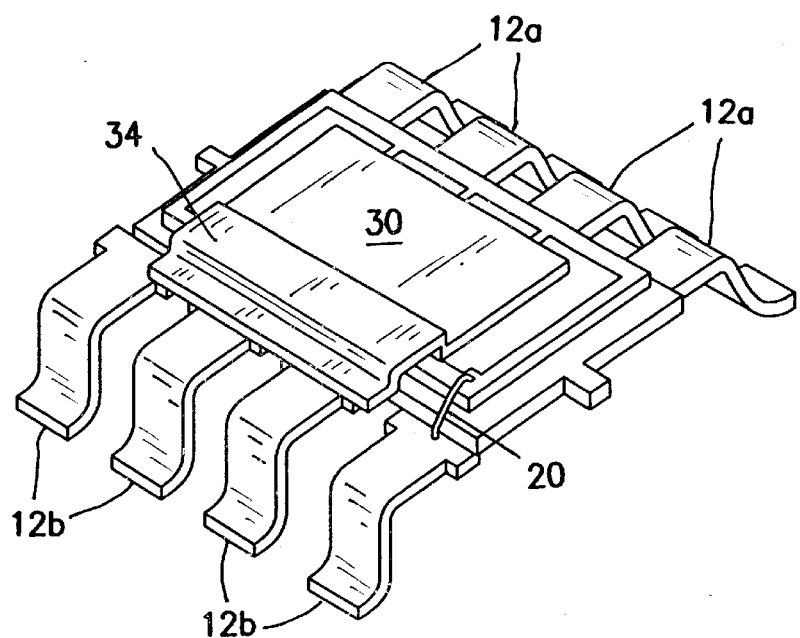
Figure 7:
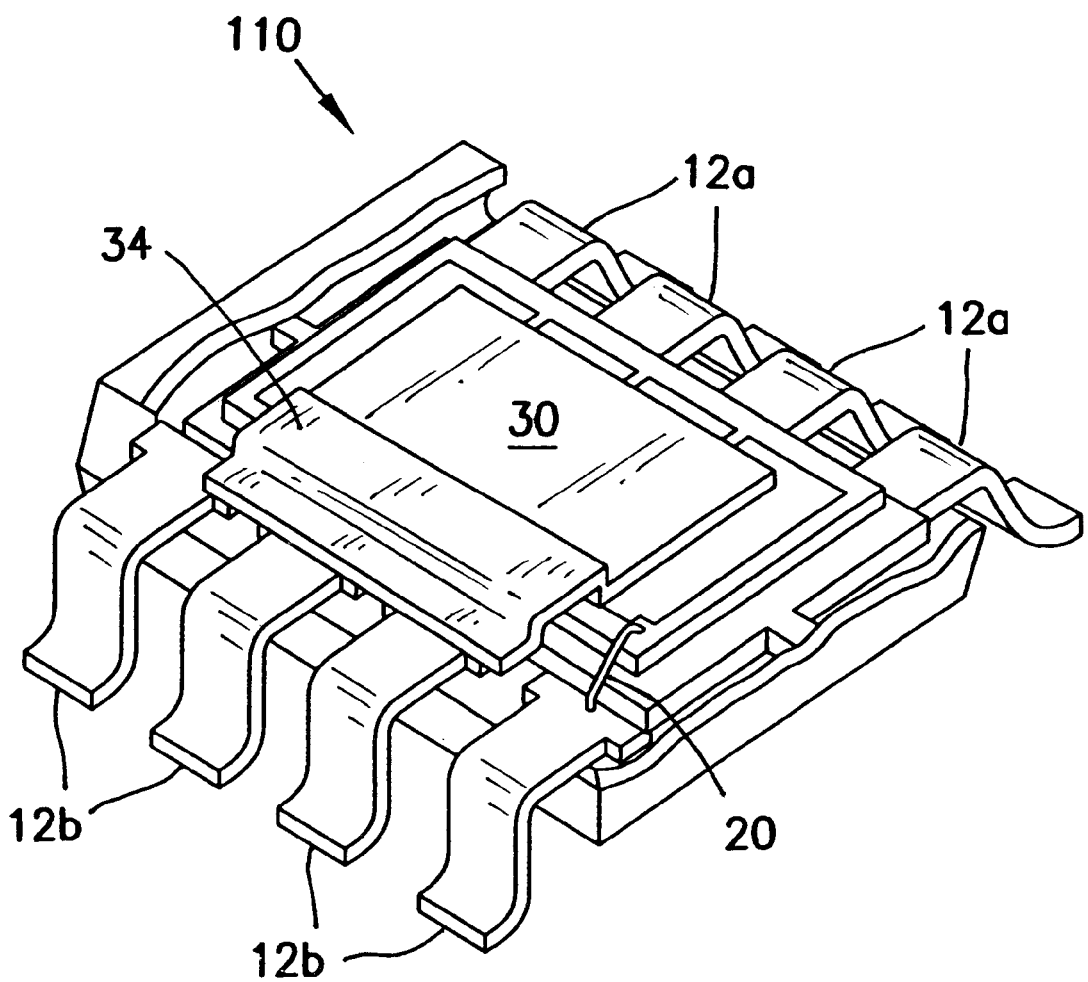

As best seen in FIG. 8, a gate runner (or bus) 19a couples the gate metalized region 19 to the source areas of the surface of the die 16. It is preferred that the plate portion 30 extend laterally beyond outermost portions of the gate runner 19a. It is also preferable that the plate portion 30 extend beyond and cover as much of the gate runner 19a as possible. This ensures that improved performance is achieved.

Figure 9:
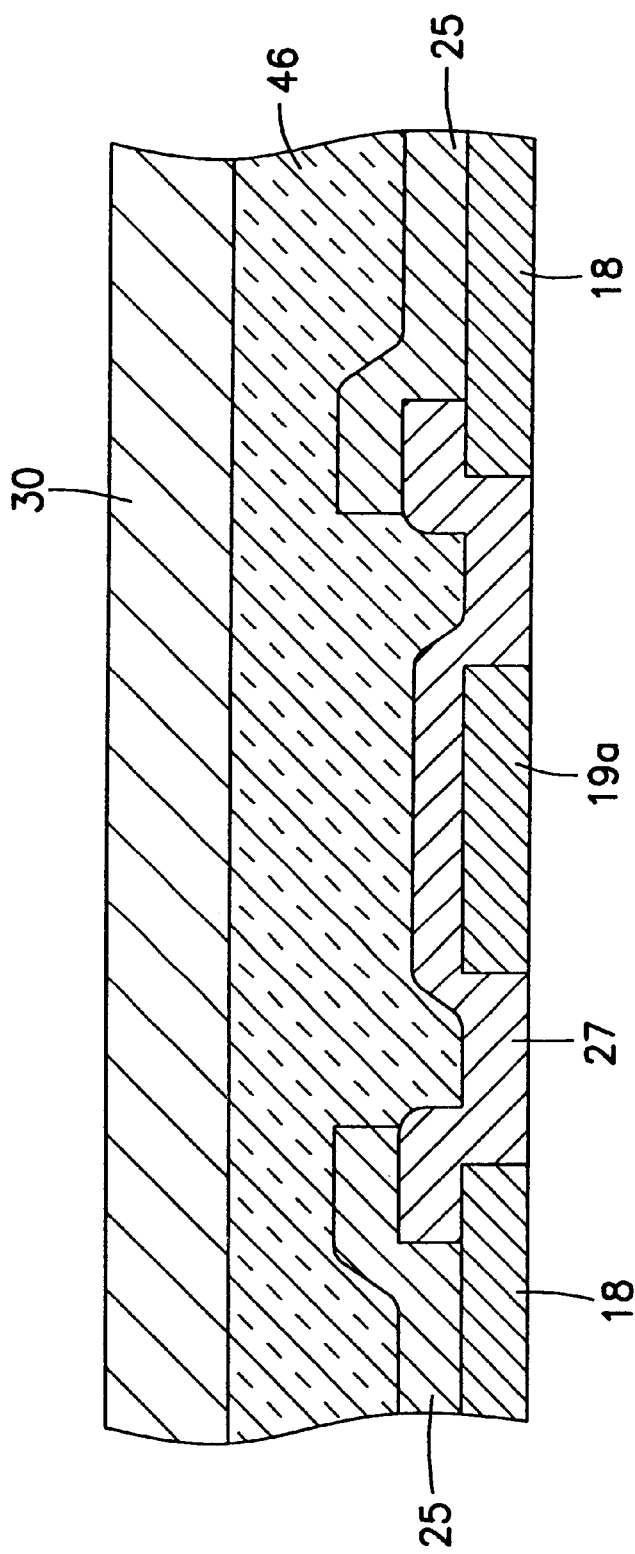
FIG. 9 is a sectional view of the semiconductor package of FIG. 8 taken along line 9—9.

FIG. 9 shows a sectional view taken along line 9—9 of FIG. 8. A portion of the gate runner 19a is shown disposed between metalized region 18. Preferably, a solderable metal (such as TiNiAg) is disposed on top of the metalized region 18. In order to insulate the gate runner 19a from the plate portion 30, a nitride layer 27 is disposed on top of the gate runner 19a. The curable conductive material 46 (preferably silver filled epoxy) is disposed on top of the solderable metal 25 and electrically and mechanically couples the plate portion 30 to metalized regions 18. Advantageously, the plate portion 30 is electrically and thermally coupled to the metalized regions 18 without interfering with the gate runner 19a.

Preferably, the thickness of the conductive material 46 is between about 0.75 to 1.0 mils (as opposed to a more common 0.33 mils). This ensures improved bonding of the plate portion 30 to the die surface. It is most preferred that Ablestik 84LM1SR4 (containing a silver filler of 75%–80%) be used as the conductive epoxy 46.

It is noted that the plate portion 30 may be soldered to the solderable metal 25 if desired. It is preferred, however, that the silver filled epoxy 46 be employed to couple the plate portion 30 to the metalized region 18. When conductive epoxy 46 is employed, it is noted that the solderable metal 25 may be eliminated and the epoxy may directly contact the metalized region 18.

Figure 10:
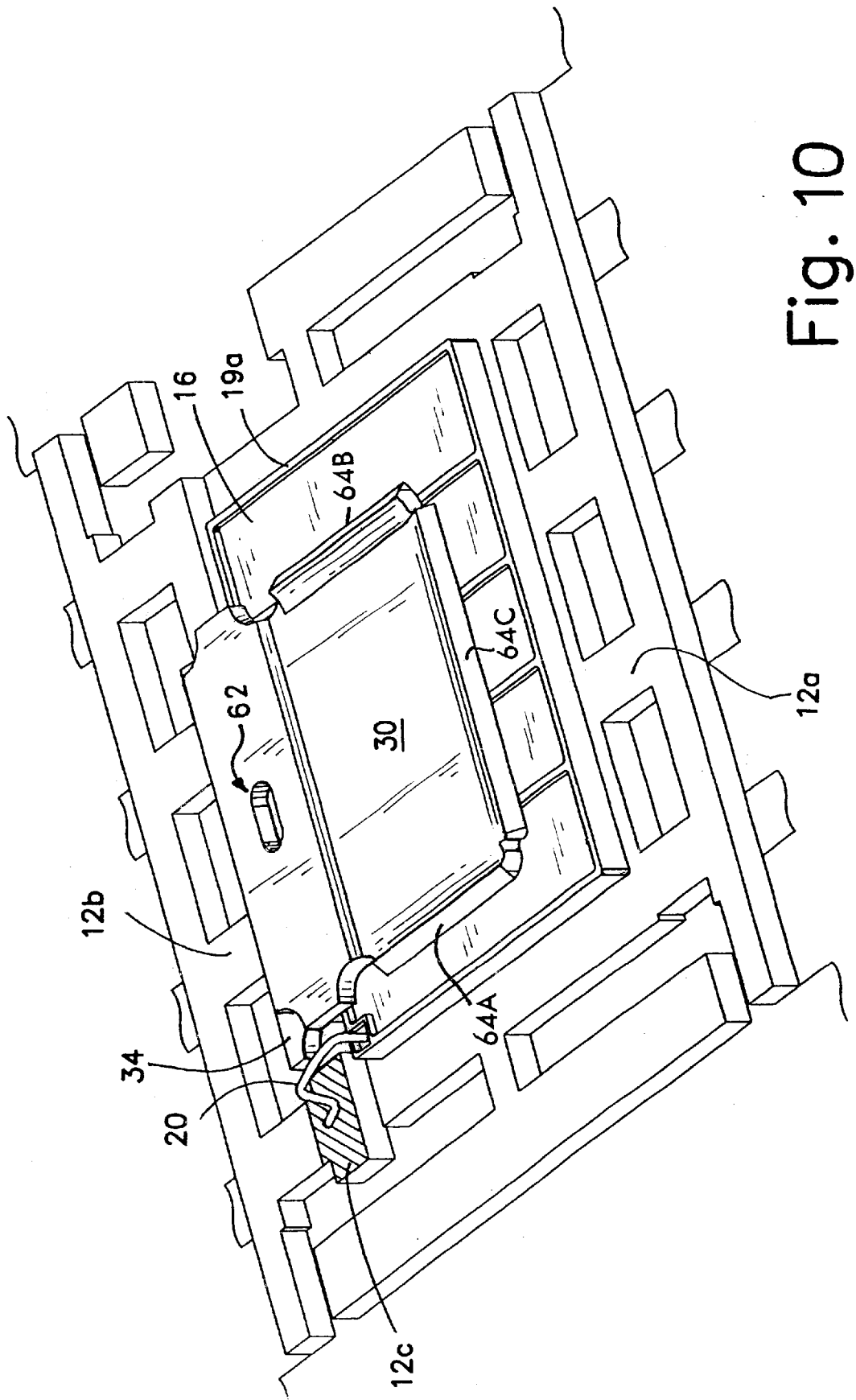
FIG. 10 is a perspective view of another alternative embodiment of the semiconductor package of the present invention.

Reference is now made to FIG. 10 which shows a perspective view of an alternative embodiment of the present invention. FIG. 10 illustrates a plate portion 30 which is similar to that shown in FIGS. 4, 6, 7, and 9. Notably, the plate portion 30 shown in FIG. 10 includes chamfered side edges 64a, 64b and a chamfered front edge 64c (also shown in FIG. 3). Advantageously, chamfered side and front edges 64a, 64b, 64c significantly reduced die surface stresses caused by the curing of, and the thermal expansion of, the curable conductive material 46. This results in a more reliable semiconductor package.

The plate portion 30 also includes an aperture 62 in, and preferably through, the beam portion 34 to improve the locking of the mold compound of the housing 22 with the plate portion 30.

As is known in the art, lead frames are typically formed from a metal, such as copper, and coated with a highly conductive material, such as silver, particularly on wire bond surfaces. The wire bond surface of terminal 12c (FIG. 10) is preferably devoid of any silver (or other material) and the wire bond 20 directly connects to terminal 12c. This results in the critical advantage of higher reliability, improved conductivity and ease of manufacture.

Reference is now made to FIGS. 11–15 which illustrate additional details of the plate portion 30 shown in FIG. 10. In particular, preferred dimensions of the plate porion 30 are illustrated including the size and shape of the chamfered edges 64a, 64b, 64c (FIGS. 11, 12). The chamfered edges 64a, 64b, 64c preferably extend upward at an angle of about 10° to 80°, 45° being most preferred. FIG. 13 shows additional details of the plate portion 30, particularly, the chamfered edge 64c, the beam portion 34, and the distal end 36.

Preferably, a plurality of mold lock depressions 68 are disposed on a top surface of the plate portion 30 (FIG. 11). Slots 66 may also be disposed on the plate portion 30 and, preferably, a combination of slots 66 and depressions 68 are employed. It is most preferred that the slots extend laterally from one side edge 64a of the plate portion 30 to an opposite side edge 64b and that rows of slots 66 and depressions 68 form a matrix on the plate portion 30. Advantageously, the slots 66, depressions 68, and/or combinations thereof improve the interlock between the mold compound of the housing 22 with the plate portion 30.

FIGS. 14 and 15 illustrate the preferred details as to the dimensions and shape of the depressions 68. It is most preferred that the slots 66, depressions 68, and/or combinations thereof are disposed on both the upper surface and an opposing lower surface of the plate portion 30. Advantageously, an improved bond of the plate portion 30 with the die surface 16 is obtained when the slots, and/or depressions 68 are employed.

It has been found that when that plate portion 30 is about 0.108×0.104 mils, the resistance introduced into the package is only about 0.115 mohms. Using metalized regions 18 aggregating about 0.08 mohms, the total package resistance according to the invention is only about 0.506 mohms (a 50% to 75% improvement over the prior art packages). Further, the thermal resistance RJA of the package of the instant invention is only about 46° C./W max (a 25% reduction over the prior art packages).

The foregoing description of the preferred embodiments of the present invention have been provided for the purposes of illustration and description. It is not intended to be exhaustive or to limit the invention to the precise forms disclosed. Many modifications and variations are possible in light of the above teaching. It is intended that the scope of the invention be limited not be this detailed description, but rather by the claims appended hereto.

What is claimed is:

1. A power semiconductor package, comprising:

a bottom leadframe having a bottom plate portion and at least one first terminal extending from the bottom plate portion;

at least one second terminal being co-planar with the first terminal; a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a conductive plate coupled to and spanning a substantial part of the first metalized region defining the source connection, the conductive plate including a periphery and at least one chamfered edge at the periphery extending upward and away from the first metalized region; and at least one beam portion being sized and shaped to couple the conductive plate portion to the at least one second terminal such that it is electrically coupled to the source wherein:

a plurality of peripheral edges define the periphery of the conductive plate;

the at least one beam portion extends from at least one peripheral edge of the metalized plate and is unitarily formed with the at least one second terminal at a distal end; and the at least one chamfered edge being disposed at the least one peripheral edge other than the at least one peripheral edge from which the beam portion extends.

2. The power semiconductor package of claim 1, wherein the conductive plate is of a substantially parallelepiped shape, the beam portion extending from one peripheral edge and the chamfered edges extending from remaining peripheral edges.

3. The power semiconductor package of claim 1, wherein the peripheral edges circumscribe top and bottom surfaces, the bottom surface defines a plane, and the at least one chamfered edge extends away from the plane at an angle from between about 10 to 80 degrees.

4. The power semiconductor package of claim 3, wherein the at least one chamfered edge extends away from the plane at an angle of about 45 degrees.

5. The power semiconductor package of claim 1, wherein the conductive plate is copper.

6. The power semiconductor package of claim 1, further comprising a layer of curable conductive material disposed between the conductive plate and the first metalized region such that the conductive plate is firmly coupled to the source.

7. The power semiconductor package of claim 1, wherein the MOSFET die includes a gate bus extending over portions of the source, further comprising a nitride layer substantially covering at least a portion of the gate bus, the conductive plate being electrically insulated from the gate bus via the nitride layer.

8. The power semiconductor package of claim 1, further comprising a layer of curable conductive material disposed between the conductive plate and the source.

9. The power semiconductor package of claim 8, wherein the curable conductive material has a thickness from about 0.75 to 1.0 mils.

10. The power semiconductor package of claim 8, wherein the curable conductive material is silver filled epoxy.

11. The power semiconductor package of claim 1, wherein the package is sized and shaped to conform to an S08 package configuration.

12. A power semiconductor package, comprising:
a bottom leadframe having a bottom plate portion and at least one first terminal extending from the bottom plate portion;
at least one second terminal being co-planar with the first terminal;
a semiconductor power MOSFET die having a bottom surface defining a drain connection and a top surface on which a first metalized region defining a source and a second metalized region defining a gate are disposed, the bottom surface being coupled to the bottom plate of the leadframe such that the first terminal is electrically connected to the drain; a conductive plate coupled to and spanning a substantial part of the first metalized region defining the source connection, a periphery of the conductive plate being defined by a plurality of peripheral edges which circumscribe top and bottom surfaces of the conductive plate;
a plurality of elongate slots disposed in at least one of the top and bottom surfaces of the conductive plate;
at least one beam portion being sized and shaped to couple the conductive plate portion to the at least one second terminal such that it is electrically coupled to the source; and a molded housing which substantially encapsulates the bottom leadframe, semiconductor die and conductive plate.

13. The power semiconductor package of claim 12, wherein the top surface of the conductive plate includes a plurality of depressions for receiving the molded housing.

14. The power semiconductor package of claim 13, wherein the depressions are oriented in a grid over the top surface of the conductive plate.

15. The power semiconductor package of claim 13, wherein the depressions are of a substantially rectangular shape.

16. The power semiconductor package of claim 12, wherein the top surface of the conductive plate includes a plurality of elongate slots for receiving the molded housing.

17. The power semiconductor package of claim 16, wherein the elongate slots are oriented in a grid over the top surface of the conductive plate.

18. The power semiconductor package of claim 12, wherein the conductive plate is copper.

19. The power semiconductor package of claim 12, wherein the at least one beam portion extends from one peripheral edge of the conductive plate and is coupled to the at least one second terminal at a distal end.

20. The power semiconductor package of claim 19, wherein the beam portion is a single member extending from the peripheral edge of the conductive plate to the at least one second terminal.

21. The power semiconductor package of claim 12, wherein the package includes a plastic housing which substantially encapsulates the bottom leadframe, semiconductor die and conductive plate.

22. The power semiconductor package of claim 12, further comprising a layer of curable conductive material disposed between the conductive plate and the first metalized region such that the conductive plate is firmly coupled to the source.

23. The power semiconductor package of claim 12, wherein the MOSFET die includes a gate bus extending over portions of the source, further comprising a nitride layer substantially covering at least a portion of the gate bus, the conductive plate being electrically insulated from the gate bus via the nitride layer.

24. The power semiconductor package of claim 12, further comprising a layer of curable conductive material disposed between the conductive plate and the source.

25. The power semiconductor package of claim 24, wherein the curable conductive material has a thickness from about 0.75 to 1.0 mils.

26. The power semiconductor package of claim 24, wherein the curable conductive material is silver filled epoxy.

27. The power semiconductor package of claim 12, wherein the package is sized and shaped to conform to an S08 package configuration.

* * * * *